United States Patent
Kamakura et al.

(10) Patent No.: US 7,295,067 B2
(45) Date of Patent: Nov. 13, 2007

(54) CURRENT SOURCE CIRCUIT AND DIFFERENTIAL AMPLIFIER

(75) Inventors: Masaomi Kamakura, Tokyo (JP); Takahiro Miki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 156 days.

(21) Appl. No.: 11/181,891

(22) Filed: Jul. 15, 2005

(65) Prior Publication Data

US 2006/0017505 A1    Jan. 26, 2006

(30) Foreign Application Priority Data

Jul. 21, 2004   (JP)  ............................. 2004-212804

(51) Int. Cl.
*H03F 3/45*     (2006.01)
(52) U.S. Cl. ...................... 330/253; 330/277
(58) Field of Classification Search ................ 330/253, 330/277; 327/359, 563
See application file for complete search history.

(56) References Cited

U.S. PATENT DOCUMENTS 5,936,466 A * 8/1999 Andoh et al. ............... 330/253

OTHER PUBLICATIONS

Razavi; "Operational Amplifiers"; *Design of Analog CMOS Integrated Circuits*; Chapter 9; pp. 296-299; c . . 2001; McGraw Hill.
Behzad, R., Design of Analog CMOS Integrated Circuits, 2001, pp. 514-515, The McGraw-Hill Companies, Inc., New York, NY, USA.

* cited by examiner

*Primary Examiner*—Khanh Van Nguyen
(74) *Attorney, Agent, or Firm*—McDermott Will & Emery LLP

(57) ABSTRACT

A current source block and a negative resistance generation block are connected in parallel. The negative resistance generation block generates a negative resistance in response to the minute variations of an output voltage. Thus the output resistance of a current source circuit is given by the combined resistance of the negative resistance and the resistance of a resistor in the current source block connected in parallel. The resistance of the resistor in the current source block and the negative resistance are controlled to be substantially the same to thereby increase the output resistance of the current source circuit. The current source circuit serves to increase an output resistance when viewed from an differential output terminal. As a result, use of this current source circuit realizes a differential amplifier providing a high gain.

5 Claims, 10 Drawing Sheets

F I G. 1
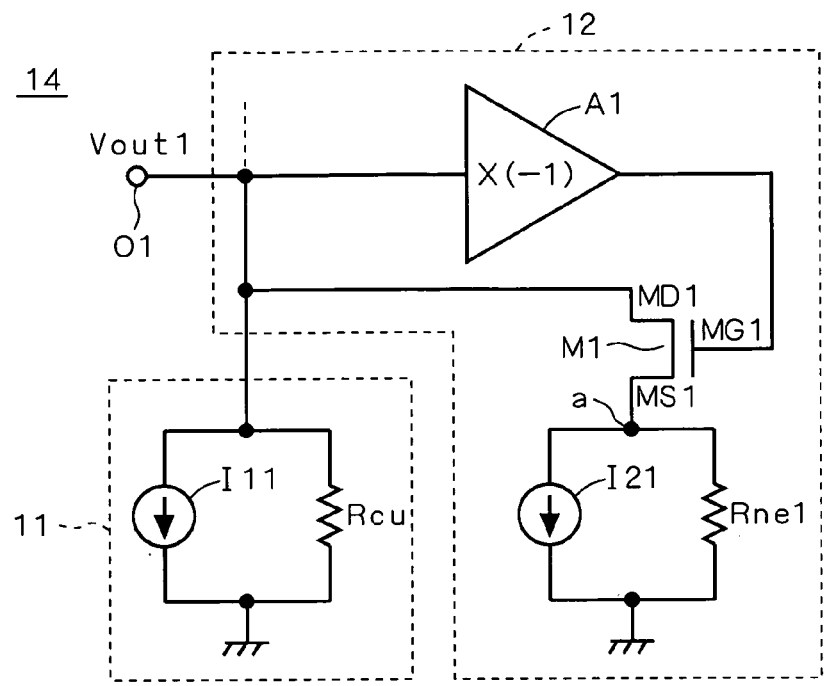
F I G. 2
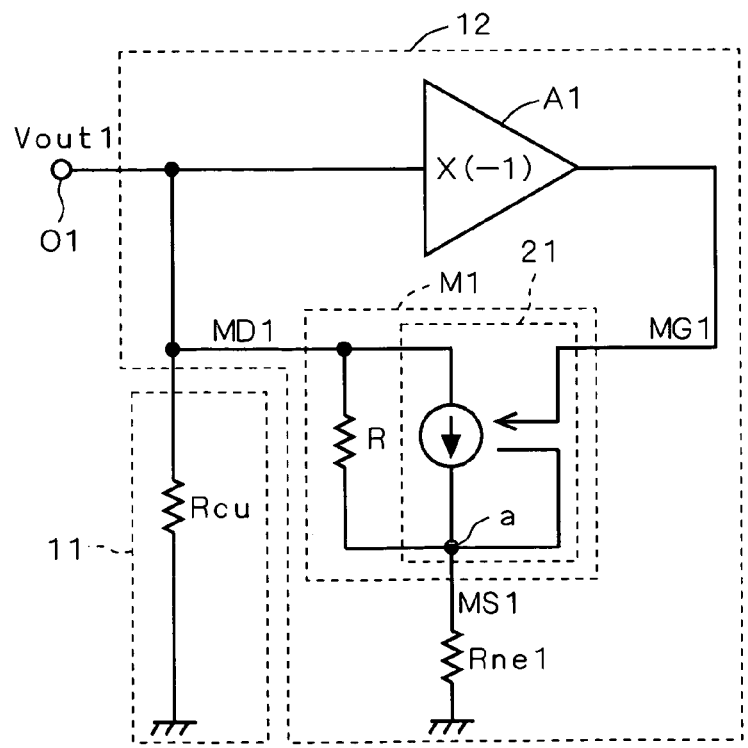

F I G . 6
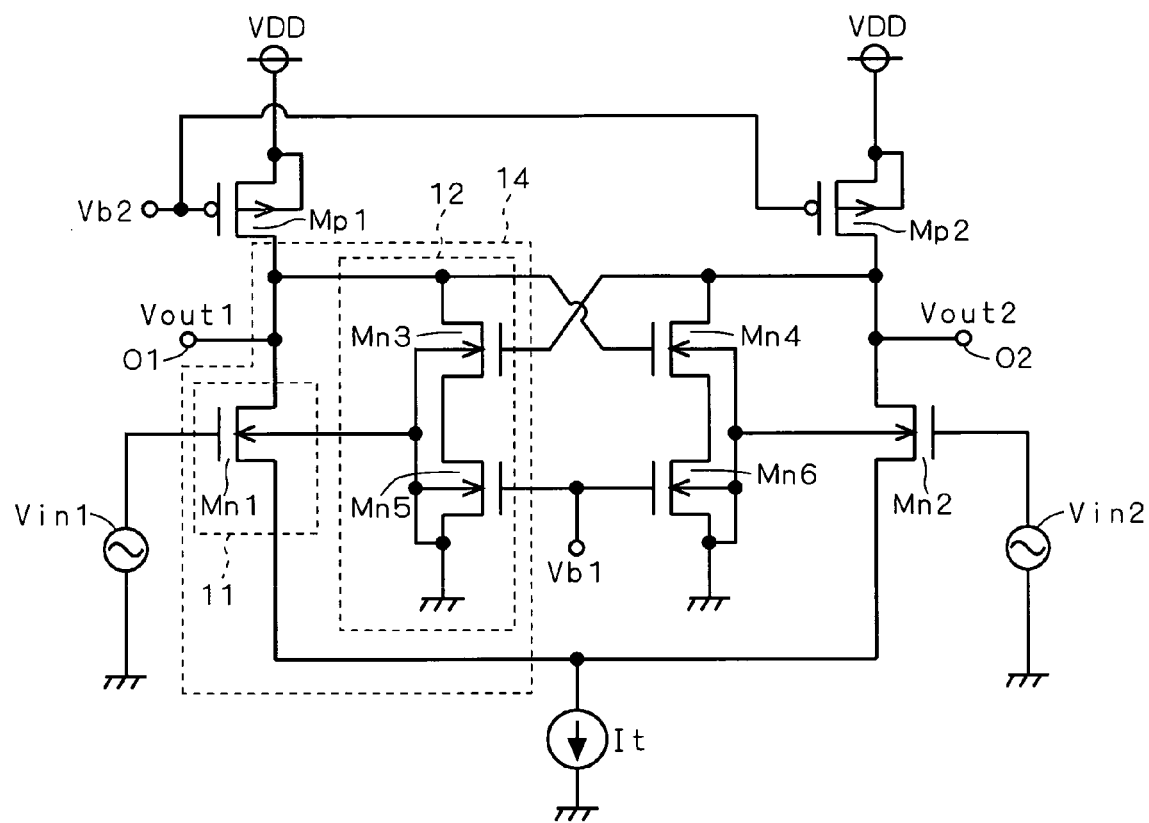

CURRENT SOURCE CIRCUIT AND DIFFERENTIAL AMPLIFIER

BACKGROUND OF THE INVENTION

1. Field of the Invention

The present invention relates to a current source circuit and a differential amplifier, and more particularly to a current source circuit realizing increase of an output resistance and a differential amplifier using this current source circuit.

2. Description of the Background Art

A current source providing a high output resistance (rds) is ideally suited in a semiconductor integrated circuit. However, a recent trend for downsizing process makes a shorter channel length of an MOS transistor. The output resistance of a current source including an MOS transistor is reduced accordingly by short channel effect.

In a differential amplifier using such a current source, the output resistance of the differential amplifier is reduced when viewed from a differential output terminal providing a differential signal. The differential amplifier provides a gain that is in proportion to the output resistance of the differential amplifier when viewed from the differential output terminal. Thus the reduced output resistance of the differential amplifier results in reduced gain of the differential amplifier.

The document named below tries to increase the gain of a differential amplifier using cascode connection:

"Design of Analog CMOS Integrated Circuits", Behzad Razavi, MacGraw-Hil Series in Electrical and Computer Engineering, pp. 296-299 (FIGS. 9.6(b) and 9.8(b)).

However, the differential amplifier using cascode connection fails to prevent the reduction of an output resistance caused by short channel effect, thus making it difficult to increase the gain of the differential amplifier.

SUMMARY OF THE INVENTION

It is an object of the present invention to provide a circuit configuration that easily provides a current source with a high output resistance even through the output resistance of an MOS transistor is reduced due to short channel effect.

According to a first aspect of the present invention, a current source circuit includes an output terminal, a current source including an internal resistor and connected to the output terminal, and a negative resistance generation block generating a negative resistance and connected in parallel to the current source.

The negative resistance generation block generating a negative resistance is connected in parallel to the current source including an internal resistor. Thus the output resistance of the current source circuit when viewed from the output terminal is given by the combined resistance of the internal resistor of the current source and the negative resistance generation block connected in parallel to the current source. When the resistance in the current source is reduced due to short channel effect, the resistance of the internal resistor and the negative resistance are controlled to be substantially the same. As a result, the output resistance of the current source circuit can be increased.

According to a second aspect of the present invention, a differential amplifier includes a differential input terminal, a differential output terminal providing a differential output signal formed by amplifying a differential input signal sent from the differential input terminal, and a negative resistance generation block generating a negative resistance and connected to the differential output terminal.

The differential amplifier includes the negative resistance generation block generating a negative resistance and connected to the differential output terminal. Thus the output resistance when viewed from the differential output terminal is given by the combined resistance of the resistor and the negative resistance generation block of the differential amplifier connected in parallel to the resistor. The differential amplifier provides a gain that is in proportion to the output resistance when viewed from the differential output terminal. Thus a gain can be increased by controlling the output resistance and negative resistance of the differential amplifier to be substantially the same.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing the configuration of a current source circuit according to a first preferred embodiment of the present invention;

FIG. 2 is a small-signal equivalent circuit of the current source circuit according to the first preferred embodiment;

FIGS. 5 and 6 are circuit diagrams each showing the configuration of a differential amplifier according to a third preferred embodiment of the present invention;

DESCRIPTION OF THE PREFERRED EMBODIMENTS

First Preferred Embodiment

Figure 3:
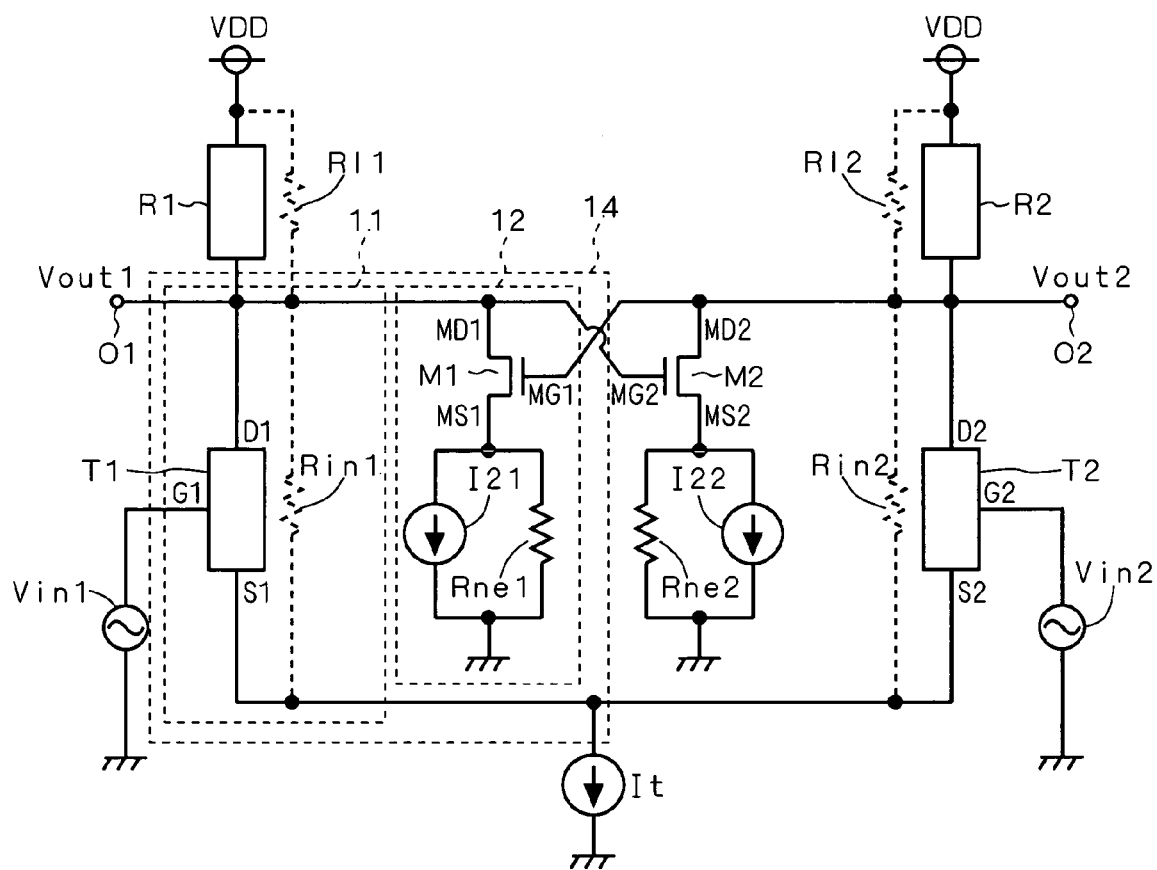
FIG. 3 is a circuit diagram showing the configuration of a differential amplifier according to a second preferred embodiment of the present invention.

FIG. 1 is a circuit diagram showing the configuration of a current source circuit 14 according to a first preferred embodiment of the present invention. The current source circuit 14 has a parallel connection of a current source block (current source) 11 and a negative resistance generation block 12.

The negative resistance generation block 12 is configured as follows. The input of an amplifier A1 (inverting amplifier) providing a voltage gain of −1 is connected to an output terminal O1 (first differential output terminal). The output of the amplifier A1 is connected to a voltage-controlled terminal MG1 of an MOS transistor (voltage-controlled current source) M1. The MOS transistor M1 has a terminal MD1 (current input terminal) connected to the output terminal O1, and a terminal MS1 (current output terminal) connected at a node a to one end of a resistor (internal resistor) Rne1 (in the following, the resistance of the resistor Rne1 will also be identified as Rne1). Another end of the resistor Rne1 is grounded. A constant current source I21 is connected in parallel to the resistor Rne1. The resistor Rne1 and the constant current source I21 form a second current source.

The current source block 11 includes a resistor (internal resistor) Rcu (in the following, the resistance of the resistor Rcu will also be identified as Rcu), and a constant current source I11. The resistor Rcu has one end connected to the terminal MD1 of the MOS transistor M1, and another end that is grounded. The resistor Rcu and the constant current source I11 are connected in parallel.

Next, it will be discussed with reference to FIG. 2 how the current source circuit 14 having the foregoing configuration operates. FIG. 2 is a small-signal equivalent circuit of the current source circuit 14 according to the first preferred embodiment. The output terminal O1 is connected to the input of the amplifier A1. The output of the amplifier A1 is connected to the gate terminal MG1 of the MOS transistor M1.

The source terminal MS1 of the MOS transistor M1 is connected to one end of the resistor Rne1. Another end of the resistor Rne1 is grounded. The terminal MD1 of the MOS transistor M1 is connected to the output terminal O1 and to one end of the resistor Rcu. Another end of the resistor Rcu is grounded. In FIG. 2, the MOS transistor M1 is represented as an equivalent circuit including a voltage-controlled current source 21 and a resistor R (whose resistance will also be identified as R) connected in parallel thereto. The resistor Rcu in the current source block 11 has one end connected to the output terminal O1 and to the drain terminal MD1 of the MOS transistor M1, and another end that is grounded.

First, it will be discussed how the negative resistance generation block 12 operates. A voltage Vout1 (output signal) is applied as a small signal to the output terminal O1 to cause a flow of a current IF in the negative resistance generation block 12. At this time, an output resistance Rout of the negative resistance generation block 12 is given by:

$$Rout = Vout1/IF \quad (1)$$

The current IF caused to flow by the application of the voltage Vout1 thereafter flows into the resistor Rne. Thus the current IF is expressed as:

$$IF = Va/Rne \quad (2)$$

where Va is a voltage at the node a.

The input of the voltage Vout1 causes the amplifier A1 to output a voltage $-Vout1$ as an inverted output signal. This causes the flow of a current ID in the voltage-controlled current source 21 given by:

$$ID = gm \cdot (-Vout1 - Va) \quad (3)$$

where gm represents a mutual conductance of the voltage-controlled current source 21.

A current expressed as (IF−ID) flows through the internal resistor R. The voltage at the node a is thus expressed as:

$$Va = Vout1 - R \cdot (IF - ID) \quad (4)$$

Expressions (2) and (3) are substituted for IF and ID in expression (4) respectively, whereby the voltage Va is expressed as:

$$Va = (Rne \cdot (1 - gm \cdot R)/(R + (1 + gm \cdot R) \cdot Rne)) \cdot Vout$$

When $(gm \cdot R \gg 1)$ and $(gm \cdot Rne \gg 1)$, the voltage Va is expressed as:

$$Va = (-gm \cdot Rne)/(1 + gm \cdot Rne) \cdot Vout$$

When $(gm \cdot R \gg 1)$ again, the voltage Va is also expressed as follows:

$$Va \approx -Vout \quad (5)$$

Using expressions (1), (2) and (5), the output resistance Rout of the negative resistance generation block 12 is finally given by:

$$Rout = Vout1/IF \approx Vout1/(-Vout1/Rne) = -Rne$$

As seen from the foregoing, the output resistance Rout of the negative resistance generation block 12 is expressed as −Rne. That is, the negative resistance generation block 12 serves to generate the negative resistance −Rne when viewed in an equivalent circuit. The negative resistance generation block 12 is connected in parallel to the resistor Rcu in the current source block 11. Then the combined resistance of the negative resistance generation block 12 and the resistor Rcu in the current source block 11 is given by:

$$Rout = Rcu//-Rne = Rcu \cdot Rne/(Rne - Rcu) \quad (6)$$

where (Rcu//−Rne) represents the combined resistance of the resistances Rcu and −Rne1 connected in parallel. If the resistance Rne1 is controlled to be substantially the same as the resistance Rcu in expression (6), the output resistance Rout of the current source circuit 14 can be increased.

When the resistances Rne1 and Rcu are reduced by short channel effect, the resistances Rne1 and Rcu are controlled to be substantially the same. As a result, the output resistance Rout of the current source circuit 14 can be increased.

Second Preferred Embodiment

FIG. 3 is a circuit diagram showing the configuration of a differential amplifier according to a second preferred embodiment of the present invention. The differential amplifier of the second preferred embodiment employs the current source circuit 14 of the first preferred embodiment. In FIG. 3, respective resistors R11 and R12 of loads R1 and R2, and respective resistors Rin1 and Rin2 of voltage-controlled current sources T1 and T2 are represented by dotted lines. In the following, the respective resistances of the resistors R11, R12, Rin1 and Rin2 will be identified by the same reference numerals.

The load R1 has one end connected to a power source voltage VDD, and another end connected to the output terminal (first differential output terminal) O1. The voltage-controlled current source T1 has a terminal D1 connected to the output terminal O1, and a terminal S1 connected to one end of a constant current source It. Another end of the constant current source It is grounded. The voltage-controlled current source T1 also has a voltage-controlled terminal (differential input terminal) G1 connected to one end of a voltage source Vin1 (whose voltage will also be identified as Vin1). The input voltage Vin1 (differential input signal) is applied to the voltage-controlled terminal G1. Another end of the voltage source Vin1 is grounded. The voltage-controlled current source T1 corresponds to the current source block 11 shown in FIG. 1.

The MOS transistor M1 has the terminal MD1 connected to the output terminal O1, and the terminal MS1 connected to one end of the resistor Rne1. Another end of the resistor Rne1 is grounded. The resistor Rne1 is connected in parallel to the constant current source I21.

The gate terminal MG1 of the MOS transistor M1 is connected to an output terminal (second differential output terminal) O2. An MOS transistor M2 has a terminal MD2 connected to the output terminal O2, and a terminal MS2 connected to one end of a constant current source I22. Another end of the constant current source I22 is grounded. A resistor Rne2 is connected in parallel to the constant current source I22.

The load R2 has one end connected to the output terminal O2, and another end connected to the power source voltage VDD. The voltage-controlled current source T2 has a terminal D2 connected to the output terminal O2, and a terminal S2 connected to one end of the constant current source It. The voltage-controlled current source T2 also has a voltage-controlled terminal G2 connected to one end of a voltage source Vin2 (whose voltage will also be identified as Vin2). Another end of the voltage source Vin2 is grounded. The voltage sources Vin1 and Vin2 each serve to generate a differential input signal.

Next, it will be discussed how the differential amplifier having the foregoing configuration operates. In FIG. 3, the left half and the right half of the differential amplifier have the same circuit configuration. When the voltage source Vin2 outputs a signal having the same amplitude as and opposite polarity to a signal given from the voltage source Vin1, an output voltage Vout2 given from the output terminal O2 (inverted differential output signal) thus has the same level as and opposite polarity to the output voltage Vout1.

The voltage-controlled terminal MG1 of the MOS transistor M1 receives the output voltage Vout2 (=−Vout1) that is the same as a signal sent from the amplifier A1 (in FIG. 1). Thus the MOS transistor M1, resistor Rne1 and constant current source I21 form the negative resistance generation block 12 discussed in the first preferred embodiment with reference to FIG. 1.

Figure 4:
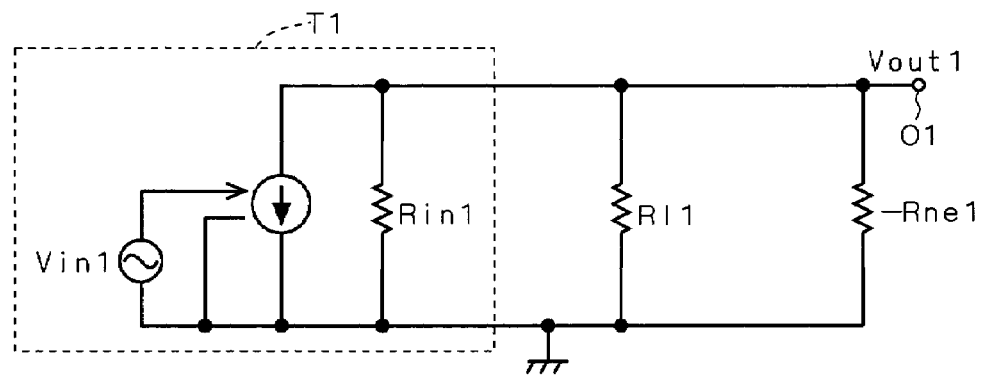
FIG. 4 is a small-signal equivalent circuit of the differential amplifier according to the second preferred embodiment.

FIG. 4 shows a small-signal equivalent circuit of the left half of the circuit configuration of the differential amplifier according to the second preferred embodiment. The resistor Rin1 of the voltage-controlled current source T1 is connected in parallel to the resistor R11 and the resistor having the resistance −Rne1. The resistor Rin1 has one end grounded and another end connected to the output terminal O1.

While one end of the load R1 is connected to the power source voltage VDD in FIG. 3, it is substantially grounded in the small-signal equivalent circuit. Thus in FIG. 4, the resistor R11 of the load R1 is shown to be connected in parallel to the resistor Rin1 of the voltage-controlled current source T1. Further, the negative resistance generation block 12 is represented as a parallel connection of the resistor Rin1 and the resistor with the resistance −Rne1.

With reference to FIG. 4, the application of the input voltage Vin1 defines the output voltage Vout1 (differential output signal) as follows:

$$Vout1 = -gm1 \cdot Vin1 \cdot (Rin1 // R11 // -Rne1)$$

where gm1 represents a mutual conductance of the voltage-controlled current source T1.

A gain A2 of the differential amplifier is finally given by:

$$A2 = Vout1 / Vin1 = -gm1 \cdot (Rin1 // R11 // -Rne1)$$

The configuration on the right side designated by different reference numerals produces the same result as that given by the left side, and hence will not be discussed.

A gain A0 obtained in a background-art differential amplifier is given by:

$$A0 = -gm1 \cdot (Rin1 // R11)$$

The combined resistance Rin1//R11 of the resistors Rin1 and R11 will be referred to as an output resistance of the background-art amplifier. The gain A0 is reduced by the decrease of the resistance of the resistor Rin1 of the voltage-controlled current source T1.

The second preferred embodiment employs the current source circuit 14 in which the voltage-controlled current source T1 and the negative resistance generation block 12 are connected in parallel. Then the gain A2 is given by:

$$A2 = -gm1 \cdot (Rin1 // R11 // -Rne1)$$

When the resistance of the resistor Rin1 of the voltage-controlled current source T1 is reduced, the output resistance (Rin1//R11) of the background-art differential amplifier and the value of the negative resistance −Rne1 are controlled to be substantially the same. As a result, the gain A2 can be increased.

Third Preferred Embodiment

Figure 5:
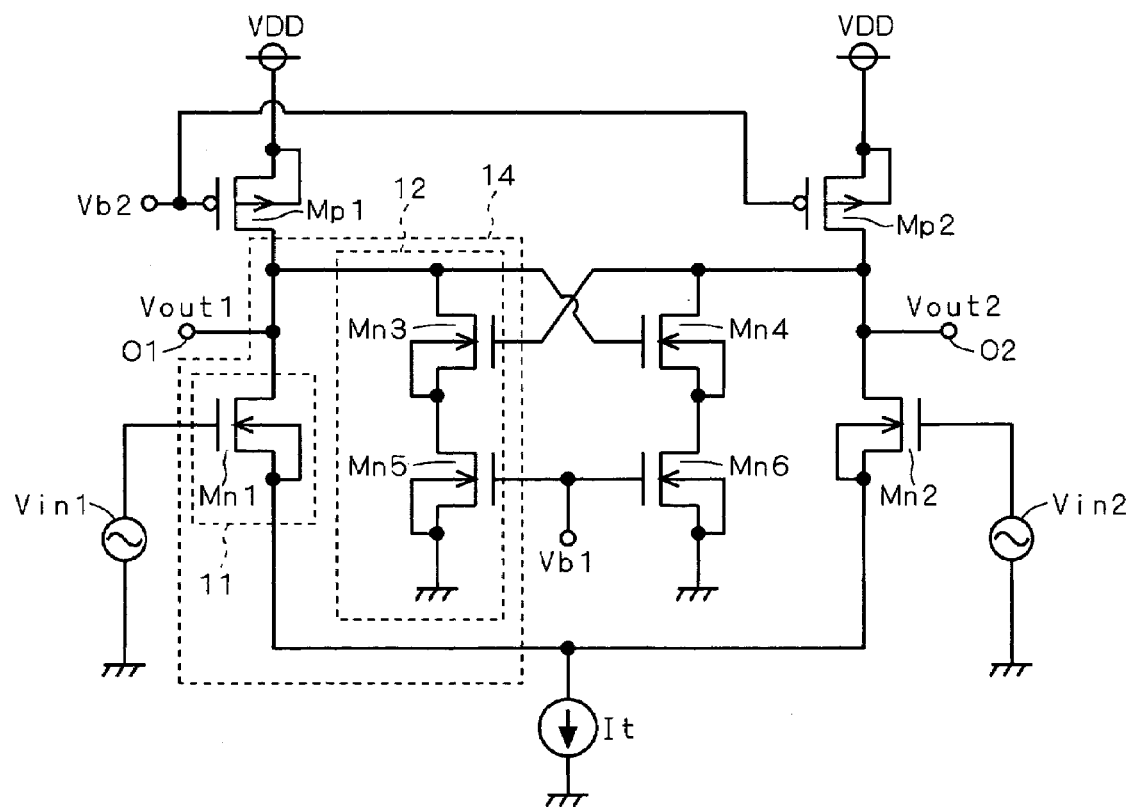

FIG. 5 is a circuit diagram showing the configuration of a differential amplifier according to a third preferred embodiment of the present invention. In the third preferred embodiment, the differential amplifier of the second preferred embodiment is more specifically configured using MOS transistors.

A PMOS transistor Mp1 has a source connected to the power source voltage VDD. The substrate terminal of the PMOS transistor Mp1 is also connected to the power source voltage VDD. The PMOS transistor Mp1 has a drain connected to the output terminal O1. An NMOS transistor Mn1 has a drain connected to the output terminal O1, a source connected to one end of the constant current source It, and a substrate terminal connected to the source.

Another end of the constant current source It is grounded. The gate of the NMOS transistor Mn1 is connected to one end of the voltage source Vin1. Another end of the voltage source Vin1 is grounded.

An NMOS transistor Mn3 has a drain connected to the output terminal O1, and a source and a substrate terminal connected to the drain of an NMOS transistor Mn5. The NMOS transistor Mn5 has a source that is grounded, and a gate subjected to the application of a voltage Vb1.

The NMOS transistor Mn3 has a gate connected to the output terminal O2. An NMOS transistor Mn4 has a drain connected to the output terminal O2. The NMOS transistor Mn4 has a source and a substrate terminal connected to the drain of an NMOS transistor Mn6. The NMOS transistor Mn6 has a source that is grounded, and a gate subjected to the application of the voltage Vb1.

A PMOS transistor Mp2 has a drain connected to the output terminal O2, and a source connected to the power source voltage VDD. An NMOS transistor Mn2 has a drain connected to the output terminal O2, a source connected to one end of the constant current source It, and a gate connected to one end of the voltage source Vin2. Another end of the voltage source Vin2 is grounded.

The voltages Vb1 and Vb2 are controlled such that the NMOS transistors Mn5 and Mn6, and the PMOS transistors Mp1 and Mp2 operate in a saturation region.

Next, it will be discussed how the differential amplifier having the foregoing configuration operates.

In the third preferred embodiment, the NMOS transistors Mn3 and MN5 form the negative resistance generation block 12. The NMOS transistor Mn3 corresponds to the MOS transistor M1 (FIG. 3). The NMOS transistor (current source) Mn5 corresponds to the constant current source I21 and the resistor Rne1 connected in parallel to the constant current source I21 (FIG. 3). The voltage Vb1 is applied to the NMOS transistor Mn5 such that the NMOS transistor Mn5 operates in a saturation region. Then identifying the output resistance of the NMOS transistor Mn5 as rn5, the output resistance rn5 corresponds to the resistance Rne1, and the negative resistance generation block 12 generates a negative resistance −rn5.

The PMOS transistor Mp1 corresponds to the load R1, and the NMOS transistor Mn1 corresponds to the voltage-controlled current source T1. Then identifying the respective output resistances of the PMOS transistor Mp1 and NMOS transistor Mn1 as rp1 and rn1, a gain A3 of the differential amplifier of the third preferred embodiment is given by:

$$A3 = -gmn1 \cdot (rn1 // rp1 // -rn5)$$

where gmn1 is a mutual conductance of the NMOS transistor Mn1.

In the configuration discussed so far, the combined resistance of the respective output resistances rn1 and rp1 of the NMOS transistor Mn1 and PMOS transistor Mp1 (rn1//rp1) (the combined resistance obtained in a background-art differential amplifier), and the output resistance rn5 of the NMOS transistor Mn5 are controlled to be substantially the same. As a result, the gain A3 can be increased.

In the third preferred embodiment, the substrate terminals of the NMOS transistors Mn1, Mn2, Mn3 and Mn4 are connected to the respective sources. These substrate terminals may alternatively be grounded as shown in FIG. 6, in which case the NMOS transistors Mn1 through Mn4 are subjected to substrate bias effect. This configuration also provides the output resistance (rn1//rp1//−m5) when viewed from the output terminal O1.

A gain A3H of the differential amplifier shown in FIG. 6 is given by:

$$A3H = -gmn1 \cdot (rn1 // rp1 // -rn5)$$

The combined resistance obtained in the background-art differential amplifier (rn1//rp1) and the output resistance rn5 of the NMOS transistor Mn5 are controlled to be substantially the same. As a result, the gain A3H can be increased. The substrate terminals of the NMOS transistors Mn3 and Mn4 may be connected to the respective sources, in which case the same effect can be obtained.

The foregoing description has been made with reference to the left half of the circuit configuration. The right half of the circuit has the same configuration as that of the left half, and produces the same effect. Further, even the absence of the constant current source It also provides the same effect.

Fourth Preferred Embodiment

Figure 7:
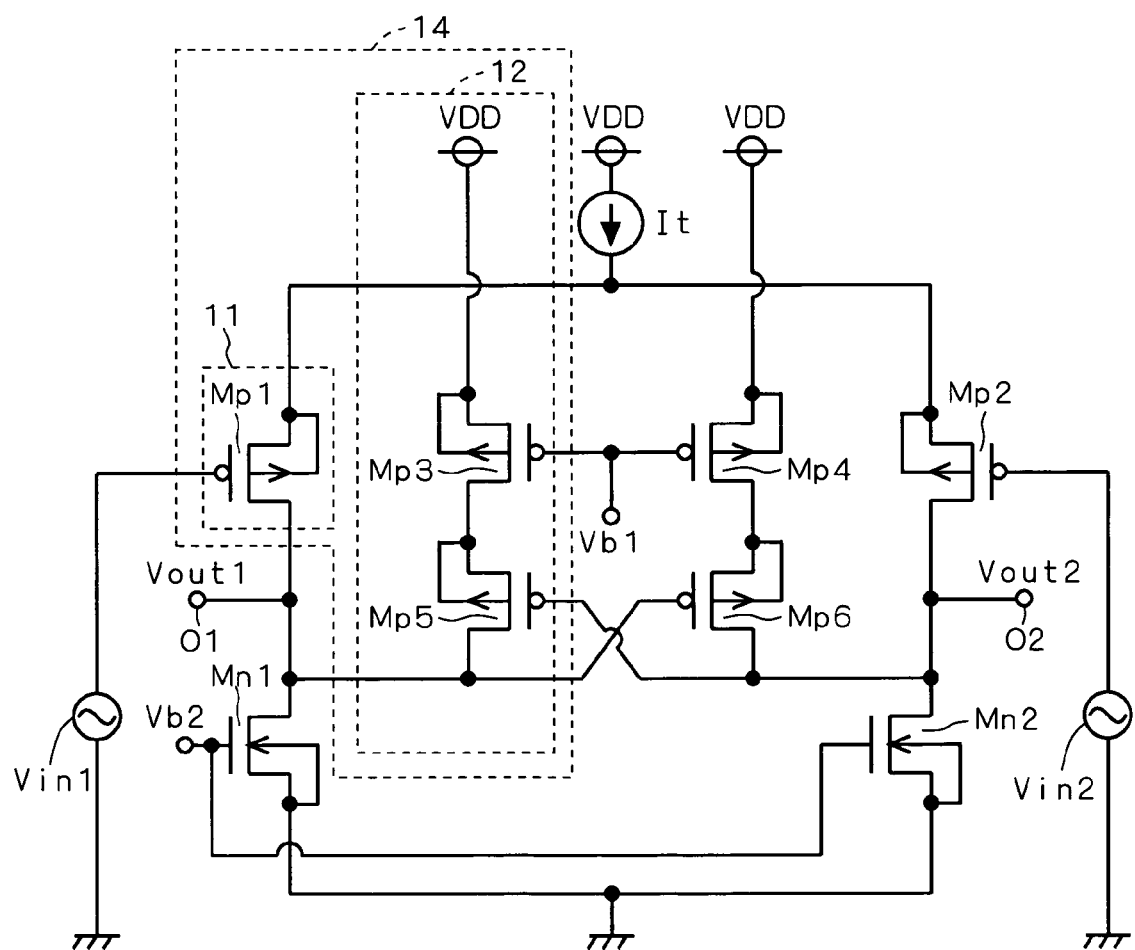
FIGS. 7 and 8 are circuit diagrams each showing the configuration of a differential amplifier according to a fourth preferred embodiment of the present invention.

FIG. 7 is a circuit diagram of a differential amplifier according to a fourth preferred embodiment of the present invention. In the fourth preferred embodiment, the differential amplifier of the second preferred embodiment is more specifically configured using MOS transistors opposite in polarity to those of the third preferred embodiment.

The NMOS transistor Mn1 has a drain connected to the output terminal O1, and a substrate terminal connected to a source that is grounded. The gate of the NMOS transistor Mn1 is subjected to the application of the voltage Vb2 such that the NMOS transistor Mn1 operates in a saturation region.

The PMOS transistor Mp1 has a drain connected to the output terminal O1, a gate connected to the voltage source Vin1 for receiving the input voltage Vin1, a substrate terminal connected to a source that is connected through the constant current source It to the power source voltage VDD. The source of the PMOS transistor Mp1 is also connected to the source of the PMOS transistor Mp2. The PMOS transistor Mp2 has a drain connected to the output terminal O2, a gate connected to the voltage source Vin2 for receiving the input voltage Vin2, and a substrate terminal connected to the source.

The NMOS transistor Mn2 has a drain connected to the output terminal O2, a source that is grounded, and a gate subjected to the application of the prescribed voltage Vb2 such that the NMOS transistor Mn2 operates in a saturation region. The substrate terminal of the NMOS transistor Mn2 is connected to the source. A PMOS transistor Mp5 has a drain connected to the drain of the NMOS transistor Mn1 and to the gate of a PMOS transistor Mp6.

The PMOS transistor Mp5 has a substrate terminal connected to a source that is connected to the drain of the PMOS transistor Mp3. The gate of the PMOS transistor Mp5 is connected to the output terminal O2 and to the drain of the PMOS transistor Mp6. The substrate terminal of the PMOS transistor Mp3 is connected to a source that is connected to the power source voltage VDD. The gate of a PMOS transistor Mp3 is subjected to the application of the voltage Vb1 of a prescribed level such that the PMOS transistor Mp3 operates in a saturation region.

The drain of the PMOS transistor Mp6 is connected to the gate of the PMOS transistor Mp5, to the output terminal O2 and to the drain of the NMOS transistor Mn2. The substrate terminal of the PMOS transistor Mp6 is connected to a source that is connected to the drain of a PMOS transistor Mp4. The gate of the PMOS transistor Mp6 is connected to the drain of the PMOS transistor Mp5.

The substrate terminal of the PMOS transistor Mp4 is connected to a source that is connected to the power source voltage VDD. The gate of the PMOS transistor Mp4 is subjected to the application of the prescribed voltage Vb1 such that the PMOS transistor Mp4 operates in a saturation region.

Next, it will be discussed how the differential amplifier having the foregoing configuration operates. In the fourth preferred embodiment, the PMOS transistors Mp3 and Mp5 form the negative resistance generation block 12. The PMOS transistor Mp5 corresponds to the MOS transistor M1 (FIG. 3). The voltage Vb1 is applied to the PMOS transistor Mp3 such that the PMOS transistor Mp3 operates in a saturation region. The PMOS transistor Mp3 corresponds to the constant current source I21 and the resistor Rne1 connected in parallel to the constant current source I21 (FIG. 3).

Identifying the output resistance of the PMOS transistor Mp3 as rp3, the output resistance rp3 corresponds to the resistance Rne1 and the negative resistance generation block 12 generates a negative resistance −rp3. The NMOS transistor Mn1 corresponds to the load R1, and the PMOS transistor Mp1 corresponds to the voltage-controlled current source T1.

Then identifying the respective output resistances of the NMOS transistor Mn1 and PMOS transistor Mp1 as rn1 and rp1, a gain A4 of the differential amplifier of the fourth preferred embodiment is given by:

$$A4 = -gmn1 \cdot (rn1 // rp1 // -rp3)$$

where gmn1 is a mutual conductance of the PMOS transistor Mp1.

In the configuration discussed so far, the combined resistance of the output resistance rn1 of the NMOS transistor Mn1 and the output resistance rp1 of the PMOS transistor Mp1 (rn1//rp1) (the combined resistance obtained in a background-art differential amplifier), and the output resistance rp3 of the PMOS transistor Mp3 are controlled to be substantially the same. As a result, the gain A4 can be increased.

Figure 8:
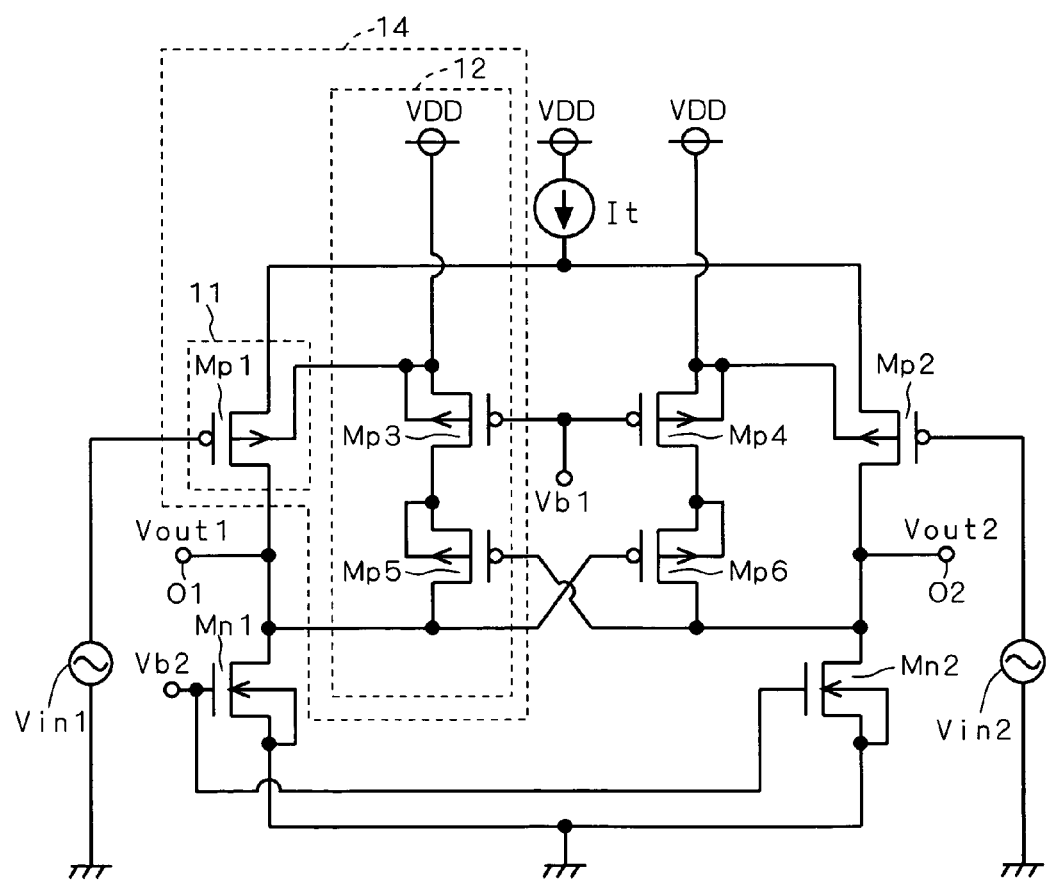

In the fourth preferred embodiment, the substrate terminals of the PMOS transistors Mp1 and Mp2 are connected to the respective sources. These substrate terminals may alternatively be connected to the power source voltage VDD as shown in FIG. 8, in which case the PMOS transistors Mp1 and Mp2 are subjected to substrate bias effect. This configuration also provides the output resistance (rn1//rp1//−rp3) when viewed from the output terminal O1.

A gain A4H of the differential amplifier shown in FIG. 8 is given by:

$$A4H = -gmn1 \cdot (rn1//rp1//-rp3)$$

The combined resistance obtained in the background-art differential amplifier (rn1//rp1) and the output resistance rp3 of the PMOS transistor Mp3 are controlled to be substantially the same. As a result, the gain A4H can be increased.

The foregoing description has been made with reference to the left half of the circuit configuration. The right half of the circuit has the same configuration as that of the left half, and produces the same effect. Further, even the absence of the constant current source It also provides the same effect.

Fifth Preferred Embodiment

Figure 9:
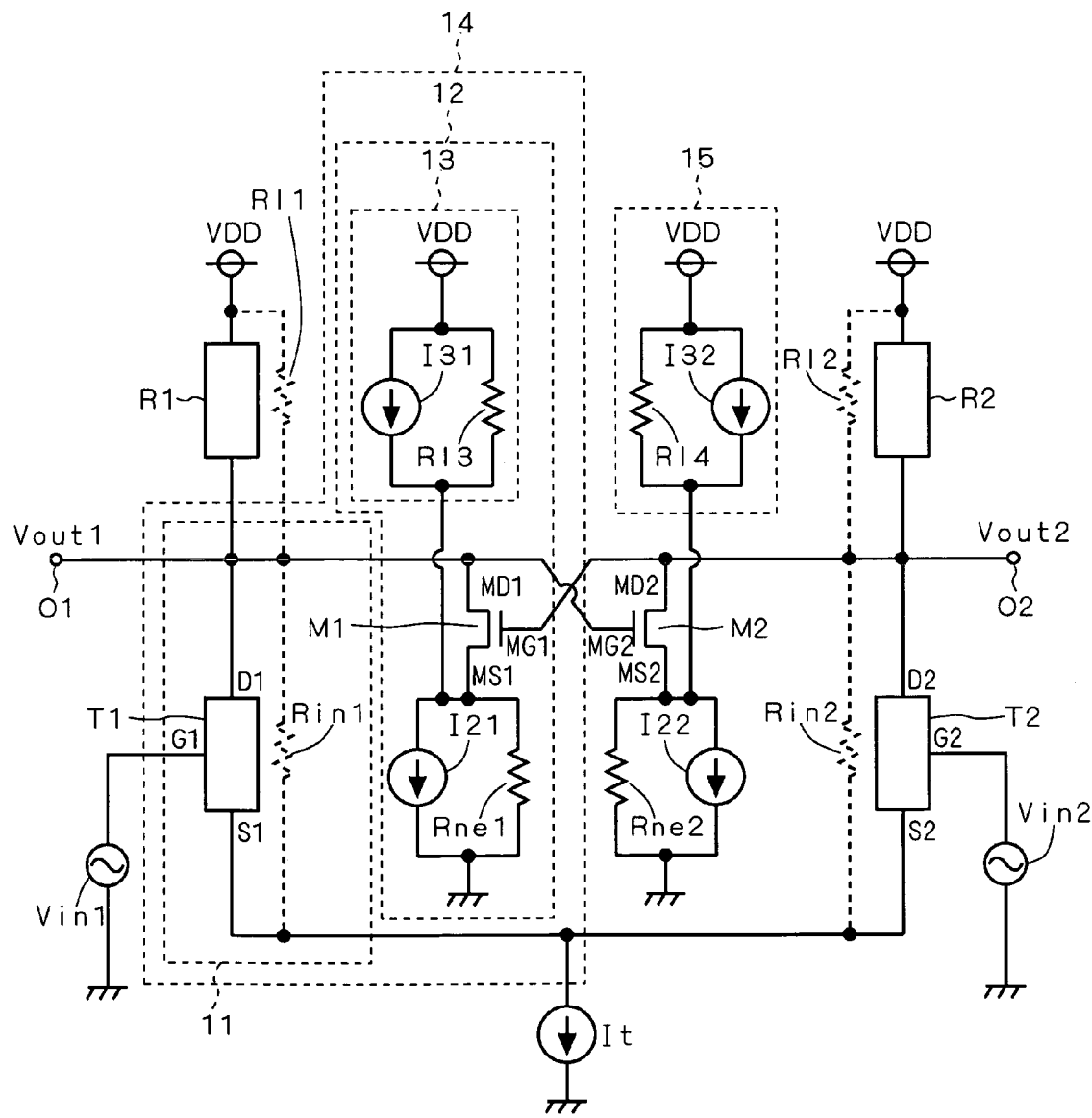
FIG. 9 is a circuit diagram showing the configuration of a differential amplifier according to a fifth preferred embodiment of the present invention.

FIG. 9 is a circuit diagram showing the configuration of a differential amplifier according to a fifth preferred embodiment of the present invention. In the fifth preferred embodiment, circuits 13 and 15 (second current source) are added to the negative resistance generation block 12 of the second preferred embodiment. The other constituents operating in the same as those of the second preferred embodiment are designated by the same reference numerals, and will not be discussed.

The circuit 13 includes a constant current source I31, and a resistor R13 (whose resistance will also be identified as R13) connected in parallel to the constant current source I31. The resistor R13 has one end connected to the power source voltage VDD, and another end connected to the resistor Rne1. The circuit 15 on the right side also includes a constant current source I32, and a resistor R14 connected in parallel to the constant current source I32.

First, the output resistance of the negative resistance generation block 12 will be discussed. In the small-signal equivalent circuit of the negative resistance generation block 12, the power source voltage VDD of the circuit 13 is grounded with respect to alternating-current components. The constant current sources I31 and I21 do not appear in the small-signal equivalent circuit. That is, the circuit 13 is coupled in ac-parallel to the circuit (first current source) formed by the resistor Rne1 and the constant current source I21. Then the output resistance of the negative resistance generation block 12 is given by the combined resistance of the resistances of the resistors R13 and Rne1 (R13//Rne1).

The combined resistance (R13//Rne1) corresponds to the resistance Rne1 of the second preferred embodiment due to the existence of the circuit 13. Thus the negative resistance generation block 12 of the fifth preferred embodiment is operative to generate a negative resistance −(Re//Rne1) in the equivalent circuit.

Then a gain A5 of the differential amplifier of the fifth preferred embodiment is given by:

$$A5 = -gm1 \cdot (Rin1//R11//-Rne1//-R13)$$

The output resistance of the background-art amplifier (Rin1//R11) is generally given by the output resistances of MOS transistors of opposite polarities. As an example, the voltage-controlled current source T1 is formed by an NMOS transistor and the load R1 is by a PMOS transistor. In contrast, the negative resistance generation block 12 of the second preferred embodiment uses an MOS transistor in one polarity to generate a negative resistance. Thus the output resistance of the negative resistance generation block 12 of the second preferred embodiment is hard to coincide in level with the output resistance (Rin1//R11) of the background-art amplifier.

In the fifth preferred embodiment, the negative resistance generation block 12 has the similar configuration to that of the background-art differential amplifier in which MOS transistors of opposite polarities are employed.

As an example, the resistor R13 may be a PMOS transistor and the resistor Rne1 may be an NMOS transistor. In this case, the output resistance is easily allowed to have a very close level to and opposite polarity to the background-art output resistance (Rin1//R11). This easily provides an increased output resistance.

Sixth Preferred Embodiment

Figure 10:
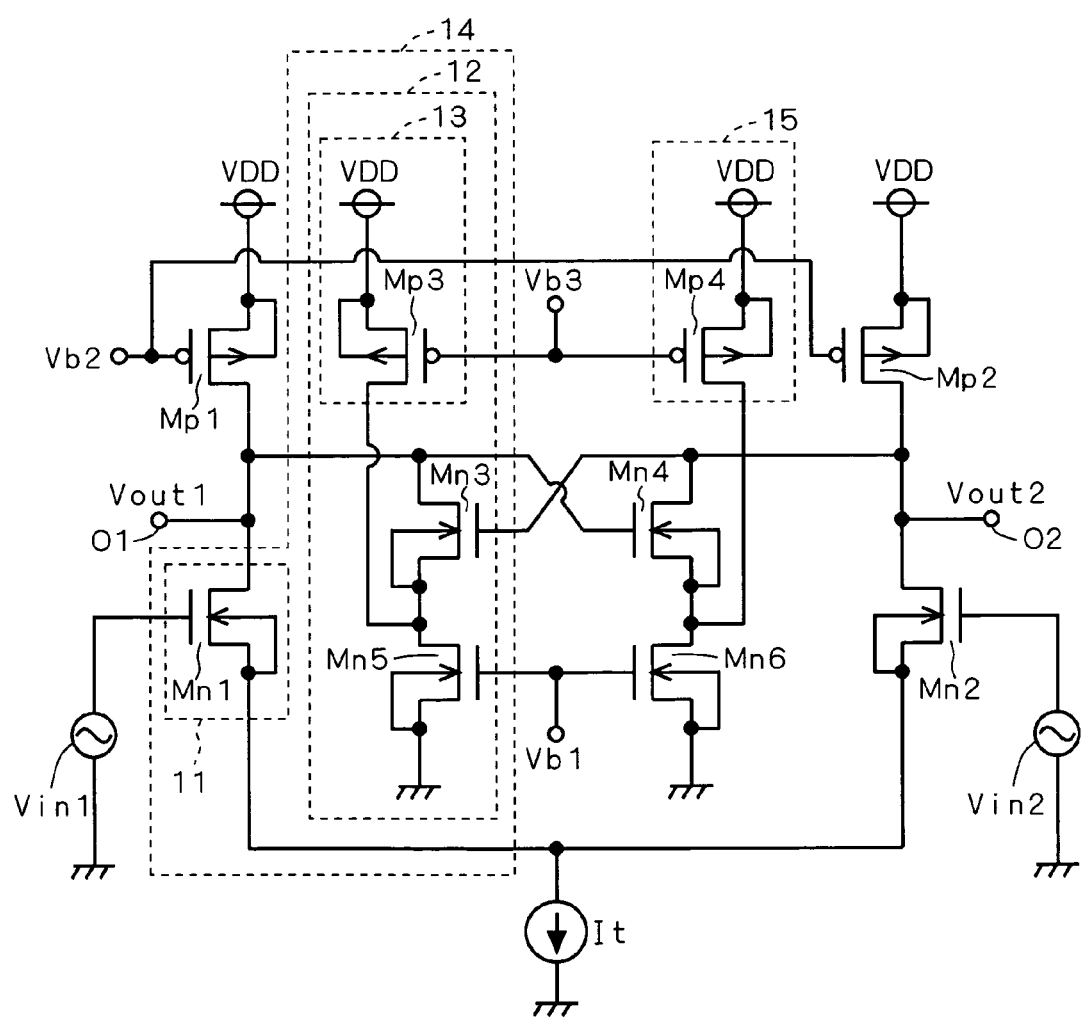
FIG. 10 is a circuit diagram showing the configuration of a differential amplifier according to a sixth preferred embodiment of the present invention.

FIG. 10 is a circuit diagram showing the configuration of a differential amplifier according to a sixth preferred embodiment of the present invention. In the sixth preferred embodiment, the differential amplifier of the fifth preferred embodiment is more specifically configured using MOS transistors. Except for the presence of the circuits 13 and 15, the differential amplifier of the sixth preferred embodiment has the same configuration as that of the third preferred embodiment (FIG. 5). The constituents operating in the same manner as those of the third preferred embodiment are designated by the same reference numerals, and will not be discussed.

The configuration of the circuit 13 will be discussed first. The PMOS transistor Mp3 has a source connected to the power source voltage VDD, a drain connected to the drain of the NMOS transistor Mn5, and a substrate terminal connected to the source. A voltage Vb3 is applied to the gate of the PMOS transistor Mp3 such that the PMOS transistor Mp3 operates in a saturation region.

Then the configuration of the circuit 15 will be discussed. The PMOS transistor Mp4 has a source connected to the power source voltage VDD, a drain connected to the drain of the NMOS transistor Mn6, and a substrate terminal connected to the source. The voltage Vb3 of a prescribed level is applied to the gate of the PMOS transistor Mp4 such that the PMOS transistor Mp4 operates in a saturation region.

Next, it will be discussed how the differential amplifier having the foregoing configuration operates. In the sixth preferred embodiment, the NMOS transistors Mn3, Mn5 and PMOS transistor Mp3 form the negative resistance generation block 12. The NMOS transistor Mn3 corresponds to the MOS transistor M1 (FIG. 9). The NMOS transistor Mn5 corresponds to the constant current source I21 and the resistor Rne1 connected in parallel to the constant current source I21 (FIG. 9). The voltage Vb1 is applied to the NMOS transistor Mn5 such that the NMOS transistor Mn5 operates in a saturation region.

The PMOS transistor (second current source) Mp3 corresponds to the constant current source I31 and the resistor R13 connected in parallel to the constant current source I31 (FIG. 9). The voltage Vb3 is applied to the PMOS transistor Mp3 such that the PMOS transistor Mp3 operates in a saturation region. Thus the output resistance rn5 of the NMOS transistor Mn5 corresponds to the resistance Rne1. The output resistance rp3 of the PMOS transistor Mp3 corresponds to the resistance R13. Thus the negative resistance generation block 12 generates a negative resistance (−rn5//−rp3). The PMOS transistor Mp1 corresponds to the load R1, and the NMOS transistor Mn1 corresponds to the voltage-controlled current source T1. Then identifying the respective output resistances of the PMOS transistor Mp1 and NMOS transistor Mn1 as rp1 and rn1, a gain A6 of the differential amplifier of the sixth preferred embodiment is given by:

$$A6 = -gmn1 \cdot (rn1//rp1//-rn5//-rp3)$$

where gmn1 is a mutual conductance of the NMOS transistor Mn1.

In the configuration discussed so far, the combined resistance of the respective output resistances rn1 and rp1 of the NMOS transistor Mn1 and PMOS transistor Mp1 (rn1//rp1), and the value of the combined resistance of the respective output resistances rn5 and rp3 of the NMOS transistor Mn5 and PMOS transistor Mp3 (−rn5//−rp3) are controlled to be substantially the same. As a result, the gain A6 can be increased.

In the sixth preferred embodiment, the substrate terminals of the NMOS transistors Mn3 and Mn4 are connected to the respective sources. These substrate terminals may alternatively be grounded, in which case the NMOS transistors Mn3 and Mn4 are subjected to substrate bias effect. This alternative configuration produces the same effect.

The foregoing description has been made with reference to the left half of the circuit configuration. The right half of the circuit has the same configuration as that of the left half, and produces the same effect. Further, even the absence of the constant current source It also provides the same effect.

Seventh Preferred Embodiment

Figure 11:
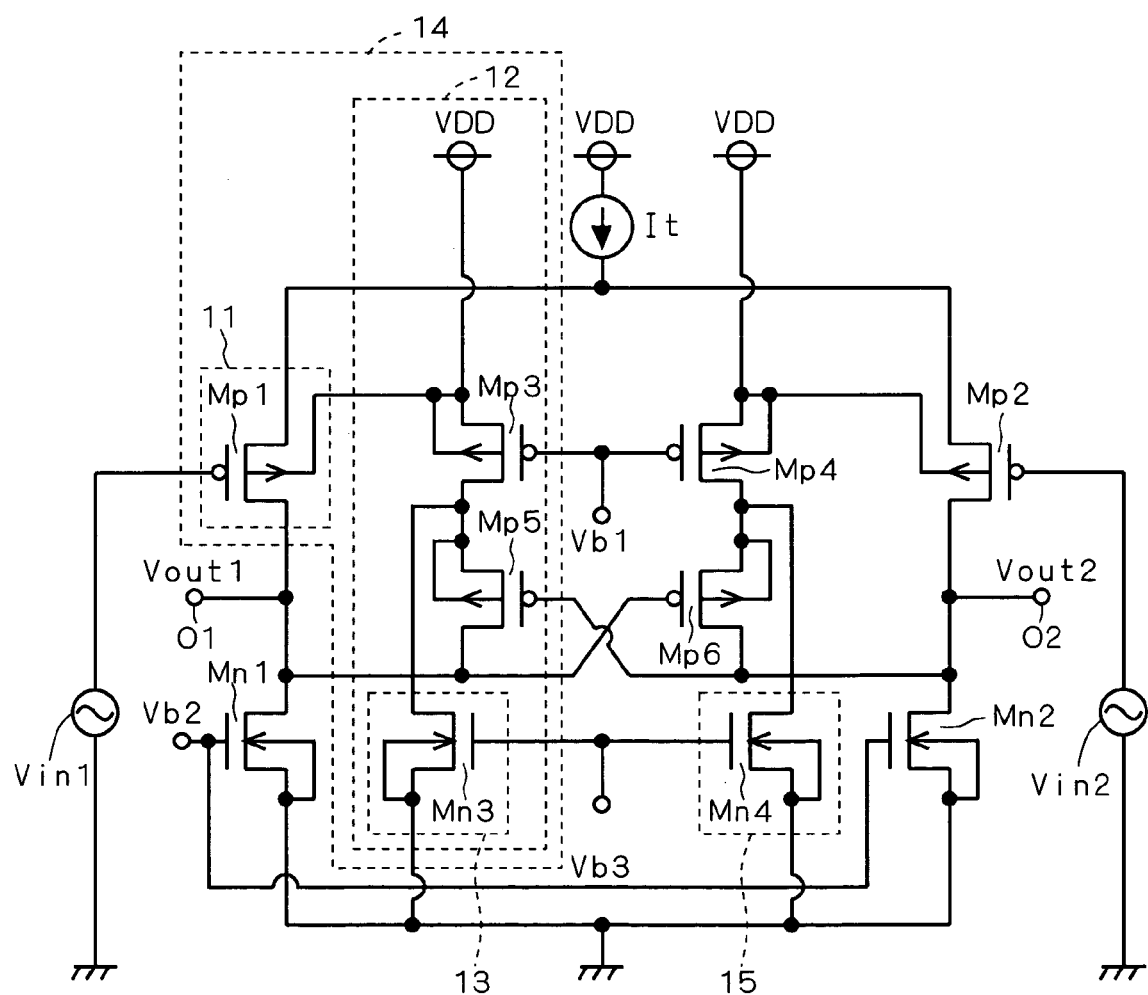
FIGS. 11 and 12 are circuit diagrams each showing the configuration of a differential amplifier according to a seventh preferred embodiment of the present invention.

FIG. 11 is a circuit diagram showing the configuration of a differential amplifier according to a seventh preferred embodiment of the present invention. In the seventh preferred embodiment, the differential amplifier of the fifth preferred embodiment is more specifically configured using MOS transistors opposite in polarity to those of the sixth preferred embodiment. Except for the presence of the circuits 13 and 15, the differential amplifier of the seventh preferred embodiment has the same configuration as that of the fourth preferred embodiment (FIG. 7). The constituents operating in the same manner as those of the fourth preferred embodiment are designated by the same reference numerals, and will not be discussed.

The configuration of the circuit 13 will be discussed first. The NMOS transistor Mn3 has a drain connected to the drain of the PMOS transistor Mp3, and a substrate terminal connected to the source that is grounded.

The configuration of the circuit 15 will be discussed next. The NMOS transistor Mn4 has a drain connected to the drain of the PMOS transistor Mp4, and a substrate terminal connected to the source that is grounded. The prescribed voltage Vb3 is applied to the NMOS transistors Mn3 and Mn4 such that the NMOS transistors Mn3 and Mn4 operate in a saturation region.

Next, it will be discussed how the differential amplifier having the foregoing configuration operates. In the seventh preferred embodiment, the PMOS transistors Mp3, Mp5 and NMOS transistor Mn3 form the negative resistance generation block 12. The PMOS transistor Mp5 corresponds to the MOS transistor M1 (FIG. 9). The PMOS transistor Mp3 corresponds to the constant current source I21 and the resistor Rne1 connected in parallel to the constant current source I21 (FIG. 9). The voltage Vb1 is applied to the PMOS transistor Mp3 such that the PMOS transistor Mp3 operates in a saturation region.

The NMOS transistor Mn3 corresponds to the constant current source I31 and the resistor R31 connected in parallel to the constant current source I31 (FIG. 9). The voltage Vb3 is applied to the NMOS transistor Mn3 such that the NMOS transistor Mn3 operates in a saturation region. Thus the output resistance rp3 of the PMOS transistor Mp3 corresponds to the resistance Rne1, and an output resistance rn3 of the NMOS transistor Mn3 corresponds to the resistance R13. Accordingly, the negative resistance generation block 12 generates a negative resistance (−rn3//−rp3).

The NMOS transistor Mn1 and PMOS transistor Mp1 respectively correspond to the load R1 and voltage-controlled current source T1. Then identifying the respective output resistances of the PMOS transistor Mp1 and NMOS transistor Mn1 as rp1 and rn1, a gain A7 of the differential amplifier of the seventh preferred embodiment is given by:

$$A7 = -gmp1 \cdot (rn1//rp1//-rn3//-rp3)$$

In the configuration discussed so far, the combined resistance of the respective output resistances rn1 and rp1 of the NMOS transistor Mn1 and PMOS transistor Mp1 (rn1//rp1), and the value of the combined resistance of the respective output resistances rn3 and rp3 of the NMOS transistor Mn3 and PMOS transistor Mp3 (−rn3//−rp3) are controlled to be substantially the same. As a result, the gain A7 can be increased. In the seventh preferred embodiment, the substrate terminals of the PMOS transistors Mp5 and Mp6 are connected to the respective sources. These substrate terminals may alternatively be connected to the power source voltage VDD, in which case the same effect can be obtained.

Figure 12:
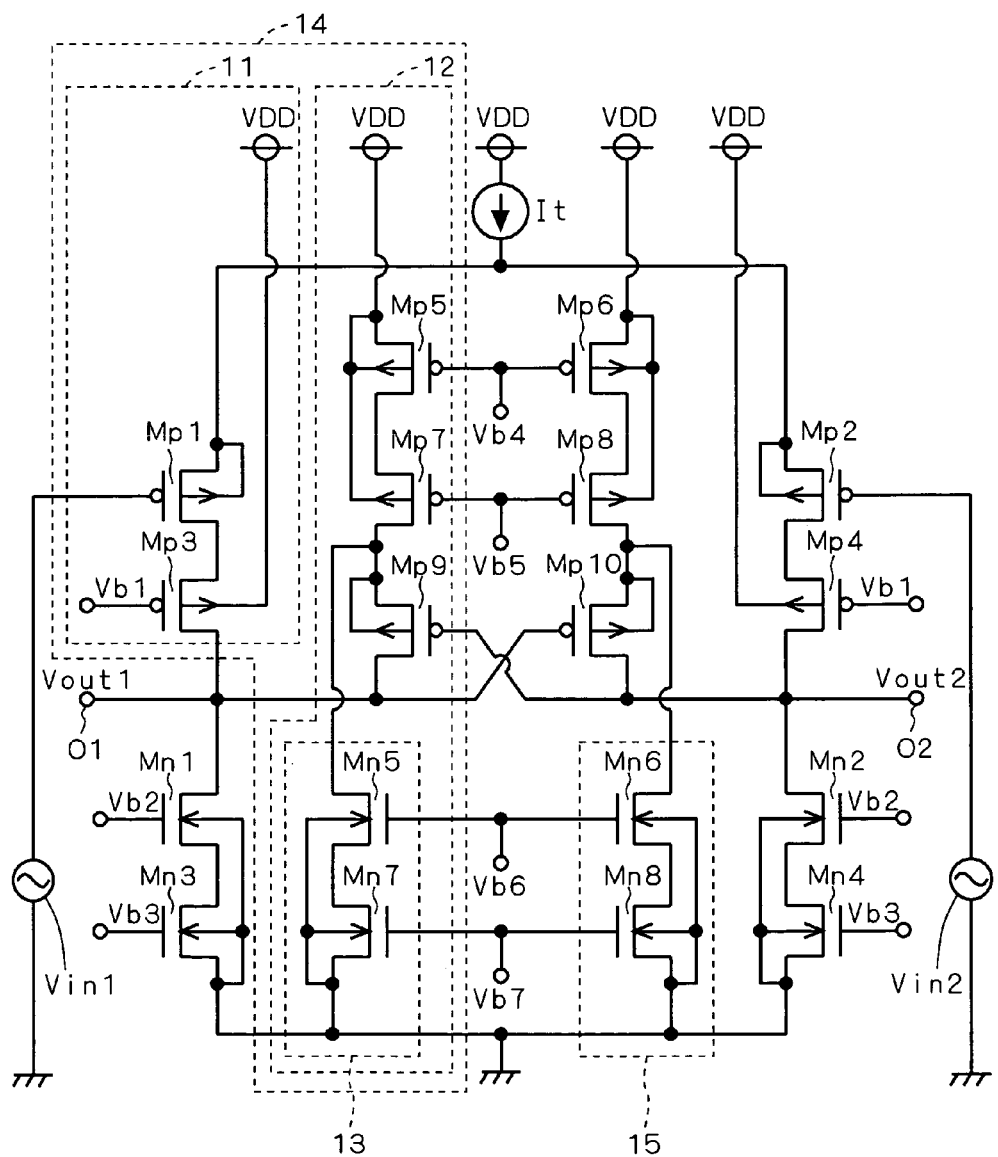

The differential amplifiers of the second preferred embodiment (FIG. 3) and fifth preferred embodiment (FIG. 9) may include cascode connection. By way of example, the circuit configuration of the differential amplifier of the fifth preferred embodiment (FIG. 9) may include cascode connection as shown in FIG. 12. Here, cascode connection means connection between transistors connected in series such as the PMOS Mp1 and Mp3 shown in FIG. 12.

The PMOS transistor Mp1 has a gate connected to the voltage source Vin1 for receiving the input voltage Vin1, and a source connected through the constant current source It to the power source voltage VDD.

The PMOS transistor Mp1 has a drain connected to the source of the PMOS transistor Mp3. The PMOS transistor Mp3 has a drain connected to the output terminal O1, and a gate subjected to the application of the prescribed voltage Vb1 such that the MOS transistor Mp3 operates in a saturation region. The PMOS transistors Mp1 and Mp3 form cascode connection.

The NMOS transistor Mn1 has as drain connected to the drain of the PMOS transistor Mp3 and to the output terminal O1, and a source connected to the drain of the NMOS transistor Mn3. The source of the NMOS transistor Mn3 is grounded. The prescribed voltages Vb2 and Vb3 are respectively applied to the gates of the NMOS transistors Mn1 and Mn3 such that the NMOS transistors Mn1 and Mn3 operate in a saturation region. The substrate terminals of the NMOS transistors Mn1 and Mn3 are grounded. The NMOS transistors Mn1 and Mn3 form cascode connection.

The PMOS transistor Mp2 has a source connected to the constant current source It, a drain connected to the source of the PMOS transistor Mp4, and a gate connected to the voltage source Vin2 for receiving the input voltage Vin2. The substrate terminal of the PMOS transistor Mp2 is connected to the source.

The PMOS transistor Mp4 has a drain connected to the output terminal O2, and a substrate terminal connected to the power source voltage VDD. The prescribed voltage Vb1 is applied to the gate of the PMOS transistor Mp4 such that the PMOS transistor Mp4 operates in a saturation region. The PMOS transistors Mp2 and Mp4 form cascode connection.

The NMOS transistor Mn2 has a drain connected to the drain of the PMOS transistor Mp4 and to the output terminal O2, and a source connected to the drain of the NMOS transistor Mn4. The source of the NMOS transistor Mn4 is grounded. The prescribed voltages Vb2 and Vb3 are respectively applied to the gates of the NMOS transistors Mn2 and Mn4 such that the NMOS transistors Mn2 and Mn4 operate in a saturation region. The substrate terminals of the NMOS transistors Mn2 and Mn4 are grounded. The NMOS transistors Mn2 and Mn4 form cascode connection.

The configuration of the negative resistance generation block 12 will be discussed next. The PMOS transistor Mp5 has a source connected to the power source voltage VDD, and a drain connected to the source of the PMOS transistor Mp7. The substrate terminals of the PMOS transistors Mp5 and Mp7 are connected to the power source voltage VDD. Voltages Vb4 and Vb5 are respectively applied to the gates of the PMOS transistors Mp5 and Mp7 such that the PMOS transistors Mp5 and Mp7 operate in a saturation region. The PMOS transistors Mp5 and Mp7 form cascode connection.

A PMOS transistor Mp9 has a source connected to the drain of the PMOS transistor Mp7, a drain connected to the output terminal O1, a substrate terminal connected to the source, and a gate connected to the output terminal O2.

The source of the PMOS transistor Mp9 is also connected to the drain of the NMOS transistor Mn5. The NMOS transistor Mn5 has a source connected to the drain of the NMOS transistor Mn7. The source of the NMOS transistor Mn7 is grounded. The substrate terminals of the NMOS transistors Mn5 and Mn7 are grounded.

Voltages Vb6 and Vb7 are respectively applied to the gates of the NMOS transistors Mn5 and Mn7 such that the NMOS transistors Mn5 and Mn7 operate in a saturation region. The NMOS transistors Mn5 and Mn7 form cascode connection.

The PMOS transistor Mp6 has a source connected to the power source voltage VDD, and a drain connected to the source of a PMOS transistor Mp8. The substrate terminals of the PMOS transistors Mp6 and Mp8 are connected to the power source voltage VDD. The voltages Vb4 and Vb5 are respectively applied to the gates of the PMOS transistors Mp6 and Mp8 such that the PMOS transistors Mp6 and Mp8 operate in a saturation region. The PMOS transistors Mp6 and Mp8 form cascode connection.

The drain of the PMOS transistor Mp8 is connected to the source of a PMOS transistor Mp10. The PMOS transistor Mp10 has a drain connected to the output terminal O2, a substrate terminal connected to the source, and a gate connected to the output terminal O1.

The source of the PMOS transistor Mp10 is also connected to the drain of the NMOS transistor Mn6. The NMOS transistor Mn6 has a source connected to the drain of the NMOS transistor Mn8. The source of the NMOS transistor Mn8 is grounded. The substrate terminals of the NMOS transistors Mn6 and Mn8 are grounded. The voltages Vb6 and Vb7 are respectively applied to the gates of the NMOS transistors Mn6 and Mn8 such that the NMOS transistors Mn6 and Mn8 operate in a saturation region. The NMOS transistors Mn6 and Mn8 form cascode connection.

Next, it will be discussed how the differential amplifier having the foregoing configuration operates. In comparison with FIG. 9, the cascode connection of the NMOS transistors Mn1 and Mn3 corresponds to the load R1. The output resistance R11 is given by $((gmn1 \cdot rn1) \cdot rn3)$. The cascode connection of the PMOS transistors Mp1 and Mp3 corresponds to the voltage-controlled current source T1. The output resistance Rin1 is given by $((gmp3 \cdot rp3) \cdot rp1)$.

The output resistance of the cascode connection formed by the PMOS transistors Mp5 and Mp7 corresponds to the resistance of the resistor Rne1 and is given by $((gmp7 \cdot rp7) \cdot rp5)$. The cascode connection of the NMOS transistors Mn5 and Mn7 corresponds to the circuit 13. The output resistance R13 is given by $((gmn5 \cdot rn5) \cdot rn7)$.

As a result of the foregoing correspondences, a gain A8 of the differential amplifier shown in FIG. 12 is given by:

$$A8 = gmp1 \cdot ((gmn1 \cdot rn1)rn3 // (gmp3 \cdot rp3)rp1 // -(gmn5 \cdot rn5)rn7 // -(gmp7 \cdot rp7)rp5)$$

where gmp1, gmp3 and gmp7 represent respective mutual conductances of the PMOS transistors Mp1, Mp3 and Mp7, and gmn1 and gmn5 represent respective mutual conductance of the NMOS transistors Mn1 and Mn5. Further, rn1, rn5 and rn7 represent respective output resistances of the NMOS transistors Mn1, Mn5 and Mn7, and rp1, rp3, rp5 and rp7 represent respective output resistances of the PMOS transistors Mp1, Mp3, Mp5 and Mp7.

In the configuration discussed so far in which the differential amplifier includes cascode connections, the output resistance of the negative resistance generation block 12 and that of the configuration excluding the negative resistance generation block 12 are controlled to be substantially the same, to thereby realize increase of a gain.

While the invention has been shown and described in detail, the foregoing description is in all aspects illustrative and not restrictive. It is therefore understood that numerous modifications and variations can be devised without departing from the scope of the invention.

What is claimed is:

1. A current source circuit, comprising:
   an output terminal;
   a first current source including an internal resistor and connected to said output terminal;
   an inverting amplifier for inverting an output signal sent from said output terminal to provide an inverted output signal;
   a MOS transistor having a current input terminal connected to said output terminal, and a voltage-controlled terminal connected to the output of said inverting amplifier and receiving said inverted output signal; and
   a second current source including an internal resistor having one end connected to a current output terminal of said MOS transistor, and another end that is grounded.

2. A differential amplifier, comprising:

a differential input terminal;

a differential output terminal providing a differential output signal formed by amplifying a differential input signal sent from said differential input terminal;

a negative resistance generation block generating a negative resistance and connected to said differential output terminal; and a second differential output terminal providing an inverted differential output signal inverted with respect to said differential output signal, wherein said negative resistance generation block comprises:

a voltage-controlled current source having a current input terminal connected to said differential output terminal, and a voltage-controlled terminal connected to said second differential output terminal and receiving said inverted differential output signal;

a current source including an internal resistor having one end connected to a current output terminal of said voltage-controlled current source, and another end that is grounded; and a second current source ac-coupled in parallel to said current source.

3. The differential amplifier according to claim 2, wherein said voltage-controlled current source is a MOS transistor, and wherein said current source and said second current source are MOS transistors operating in a saturation region.

4. The differential amplifier according to claim 2, wherein said voltage-controlled current source is a MOS transistor, and wherein said current source and said second current source include cascode connection of transistors.

5. A differential amplifier, comprising:

a differential input terminal;

a first differential output terminal providing a differential output signal formed by amplifying a differential input signal sent from said differential input terminal;

a second differential output terminal providing an inverted differential output signal inverted with respect to said differential output signal;

a load having one end connected to a power source voltage and another end connected to said first differential output terminal;

a voltage-controlled current source having a current input terminal connected to said first differential output terminal, and a voltage-controlled terminal connected to said differential input terminal and receiving said differential input signal;

a constant current source having one end connected to a current output terminal of said voltage-controlled current source, and another end that is grounded;

a MOS transistor having a current input terminal connected to said first differential output terminal, and a voltage-controlled terminal connected to said second differential output terminal and receiving said inverted differential output signal;

a first current source including an internal resistor having one end connected to a current output terminal of said MOS transistor, and another end that is grounded; and a second current source having one end connected to said power source voltage and another end connected to said first current source.

* * * * *